United States Patent [19]
Sullivan et al.

[11] Patent Number: 5,391,257
[45] Date of Patent: Feb. 21, 1995

[54] METHOD OF TRANSFERRING A THIN FILM TO AN ALTERNATE SUBSTRATE

[75] Inventors: Gerard J. Sullivan, Thousand Oaks; Mary K. Szwed, Huntington Beach; Mau-Chung F. Chang, Thousand Oaks, all of Calif.

[73] Assignee: Rockwell International Corporation, Seal Beach, Calif.

[21] Appl. No.: 165,050

[22] Filed: Dec. 10, 1993

[51] Int. Cl.⁶ .................. H01L 21/306; B44C 1/22
[52] U.S. Cl. .................... 156/630; 156/631; 156/643; 156/633; 156/662; 437/86; 437/974
[58] Field of Search .............. 156/630, 631, 633, 643, 156/636, 645, 655, 662, 663; 437/86, 225, 228, 247, 974

[56] References Cited

U.S. PATENT DOCUMENTS

| | | | |
|---|---|---|---|
| 3,959,045 | 5/1976 | Antypas | 437/86 X |
| 5,013,681 | 5/1991 | Godbey et al. | 437/86 |
| 5,073,230 | 12/1991 | Maracas et al. | 156/631 |
| 5,261,999 | 11/1993 | Pinker et al. | 156/630 |

OTHER PUBLICATIONS

E. Yablonovitch et al., "Extreme selectivity in the lift-off of epitaxial GaAs films," *Appl. Phys. Lett.*, vol. 51, No. 26, pp. 2222–2224, Dec. 28, 1987.

E. Yablonovitch et al., "Van der Waals bonding of GaAs on Pd leads to a permanent, solid-phase-topotaxial, metallurgical bond," *Appl. Phys. Lett.*, vol. 59, No. 24, pp. 3159–3161, Dec. 9, 1991.

C. Camperi-Binestet et al., "Alignable Epitaxial Liftoff of GaAs Materials with Selective Deposition Using Polyimide Diaphragms", *IEEE Transactions Photonics Technology Letters*, vol. 3, No. 12, pp. 1123–1126, Dec. 1991.

J. Callahan et al., "Alignable Liftoff Transfer of Device Arrays via a Single Polymeric Carrier Membrane," *Electronics Letters*, vol. 29, No. 11, pp. 951–953, May 27, 1993.

*Primary Examiner*—William Powell
*Attorney, Agent, or Firm*—John C. McFarren

[57] ABSTRACT

A method is described for transferring a thin film of arbitrarily large area from an original substrate to an alternate substrate. An etch stop layer is provided below an epitaxial layer, for example, grown on a semiconductor substrate. In a single transfer process, the epitaxial layer is bonded to a rigid host substrate having desirable thermal, electromagnetic, and/or mechanical properties. The original growth substrate is then removed from the transferred epitaxial layer using the etch stop layer. In a double transfer process, the epitaxial layer is first bonded to a rigid and porous temporary substrate using a thermally or chemically releasable resin, for example. The original growth substrate is removed using the etch stop layer so that the original substrate side of the epitaxial layer can be bonded to a rigid host substrate, as described above. The temporary substrate is then removed using the releasable resin to leave the transferred thin film attached to the host substrate.

17 Claims, 2 Drawing Sheets

METHOD OF TRANSFERRING A THIN FILM TO AN ALTERNATE SUBSTRATE

TECHNICAL FIELD

The present invention relates to the fabrication of thin film devices and, in particular, to a method of transferring a thin film to an alternate substrate.

BACKGROUND OF THE INVENTION

During fabrication of thin film devices, such as semiconductor devices having epitaxial layers, it is sometimes desirable to transfer a thin layer from one supporting substrate to another. For example, lattice-matched epitaxial growth may require a substrate of a certain material that has other characteristics, such a thermal, mechanical, and/or electromagnetic properties, that produce less than optimal performance in the final device or system. In such a case, performance may be substantially improved by transferring the thin epitaxial layer from the growth substrate to another substrate that has the desired thermal, mechanical, and/or electromagnetic properties.

Epitaxial films can be separated from their original growth substrates using known materials processing techniques generally referred to as epitaxial liftoff (ELO). One such process uses east films of "black wax" (Apiezon W) atop the epitaxial layer to provide support after separation from the original substrate. Bonding to a new substrate can be achieved through Van der Waals attraction to the new surface or metallurgical interactions with a gold or palladium coating. Black wax, however, is not easily manipulated, and the method of casting is not part of a normal microelectronics fabrication process. The total area that can be lifted using black wax is small, unless the epitaxial layer and wax are bent away from the substrate to allow the etching agent to get deeper under the layer. Bending of a thin epitaxial layer, however, is not desirable because it can damage the materials or structures of the layer. Furthermore, post processing of the lifted film suffers from the fragility, opacity, and low tolerance of black wax to solvents and elevated temperatures.

Another known ELO process uses polyimide films to support both continuous and patterned epitaxial structures. Use of transparent polyimide as a membrane material facilitates vacuum deposition on the back surface of the epitaxial material after liftoff and before grafting. Perforation of the polyimide membrane allows visibility through the membrane to the host substrate, even after metal film deposition on the underside. These attributes facilitate manipulation and alignment of arrays of previously fabricated devices without the need for transfer from the primary temporary support membrane to a secondary membrane. The flexibility of polyimide membranes, however, can cause damage to thin film circuit devices as a result of bending.

If the thin film to be transferred is held by a rigid temporary substrate, a problem may be encountered releasing the film from the temporary substrate after the film has been attached to the host substrate. For example, dissolving a glue bond with solvents is effective only for small sections since the rate of dissolution drops exponentially with distance from an edge. One approach to this problem has been to glue the thin film to a temporary substrate of silicon that has had many holes etched through it. This allows solvents better access to the bonding glue, but fragile circuit films can be damaged where they bridge the relatively large holes etched in the silicon substrate.

Because of the deficiencies in the known methods of transferring thin films to alternate substrates, there has been a need for a method of transferring thin films that is effective, does not damage fragile films, can transfer entire wafers reliably, and is compatible with established semiconductor fabrication processes.

SUMMARY OF THE INVENTION

The present invention comprises a method of transferring a thin film, such as a semiconductor epitaxial layer, from an original substrate to an alternate host substrate. In the preferred embodiment, an etch stop layer is provided below an epitaxial layer grown on a semiconductor substrate. In a single transfer process, the epitaxial layer is bonded, using metallic solder, for example, to a rigid host substrate having desirable thermal, electromagnetic, and/or mechanical properties. The original growth substrate is then separated from the transferred epitaxial layer using the etch stop layer. In a double (or multiple) transfer process, the epitaxial layer is first bonded to a rigid, porous, temporary support substrate using a thermally or chemically releasable resin, for example. The original growth substrate is removed using the etch stop layer so that the side of the epitaxial layer originally abutting the growth substrate can be bonded to the rigid host substrate, as described above. The temporary substrate is then removed using the releasable resin, leaving the transferred epitaxial layer attached to the host substrate.

A principal object of the invention is a method of transferring thin films to alternate substrates. A feature of the invention is use of a temporary substrate that is rigid, porous with uniform small pores, and easily releasable from transferred thin films. An advantage of the invention is the use of rigid substrates to support transferred thin films having large areas.

BRIEF DESCRIPTION OF THE DRAWINGS

For a more complete understanding of the present invention and for further advantages thereof, the following Detailed Description of the Preferred Embodiment makes reference to the accompanying Drawings, in which.

DETAILED DESCRIPTION OF THE PREFERRED EMBODIMENT

During fabrication of some types of semiconductor devices, it may be desirable to transfer thin epitaxial layers from the growth substrate to another supporting substrate. Lattice-matched epitaxial growth may require a substrate of a certain material, for example a III-V semiconductor such as gallium arsenide or indium phosphide, that has less than optimal thermal, mechanical, and/or electromagnetic characteristics with respect to performance of finished devices or systems, such as light emitting diodes, lasers, and high power heterojunction bipolar transistor (HBT) amplifiers. In such devices, performance can be significantly improved by transferring the thin epitaxial layer (or layers) from the growth substrate to another substrate, such as diamond or aluminum nitride, for example, that has the desired thermal, mechanical, and/or electromagnetic properties. The actual thin film to be transferred may comprise unprocessed epitaxial layers, functional circuits, microelectromechanical devices, or other thin film structures.

The method of the present invention is particularly useful for fabricating high power HBT amplifiers. A single transfer process is illustrated schematically in FIGS. 1A–F. A GaAs substrate 10 is prepared with an etch-stop layer 12, that may comprise AlAs or AlGaAs, for example. An epitaxial layer 14 is then grown atop the etch-stop layer 12. Epitaxial layer 14 may comprise one or more epitaxial growths or thin layers, such as GaAs, InGaAs, and AlGaAs for fabricating HBTs, for example.

Figure 1A:
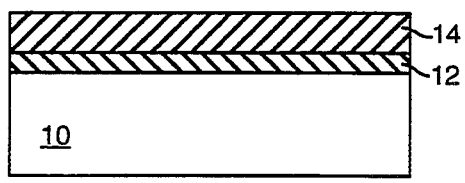
FIGS. 1A–F are schematic cross-sections illustrating the transfer of a thin film to an alternate substrate using a single transfer process of the present invention.
Figure 1B:
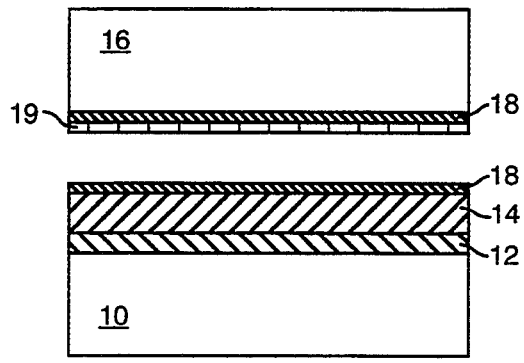

After substram 10 has been prepared with etch-stop layer 12 and epitaxial layer 14, the top of epitaxial layer 14 is bonded to a host substrate 16, comprising a material such as diamond or aluminum nitride (AlN), for example, that has desirable thermal, mechanical, and/or electromagnetic properties. Bonding of layer 14 to host substrate 16 may be accomplished using a resin or glue, a metallic solder for good thermal conductivity, or chemical bonds that would form if host substrate 16 were deposited directly on top of layer 14. In the process illustrated in FIGS. 1A–F, epitaxial layer 14 and host substrate 16 are coated with metal adhesion and barrier layers 18, which may comprise Ti/Pd barrier metal, for example. Metal layers 18 can then be bonded using a bonding layer 19 of indium (In) or tin (Sn) conductive metal, for example, applied to either or both of metal barrier layers 18. The layers of FIG. 1B are brought together and heated so that bonding layer 19 solders metal barrier layers 18 together to form a solid, thermally conductive bond as shown in FIG. 1C.

Figure 1C:
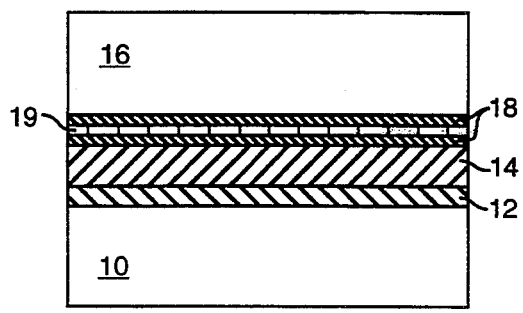
Figure 1D:
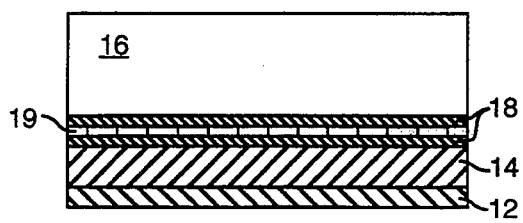
Figure 1E:
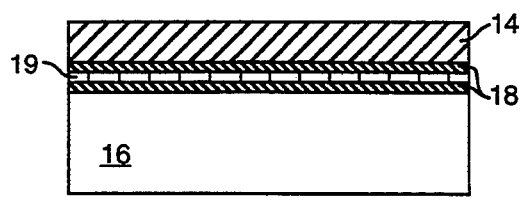
Figure 1F:
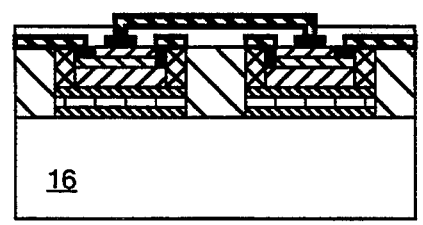

After bonding to form the structure of FIG. 1C, original substrate 10 can be lapped and then reactive ion etched up to etch-stop layer 12, as shown in FIG. 1D. Etch-stop layer 12 can then be removed by selective etching and the whole structure inverted, as shown in FIG. 1E, for conventional fabrication of circuit devices, as illustrated in FIG. 1F. In this single transfer process, epitaxial layer 14 (which may comprise a plurality of thin layers as described above) is now inverted from its original growth sequence.

Figure 2A:
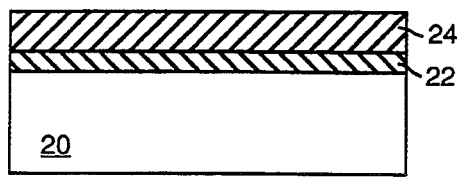
FIGS. 2A–F are schematic cross-sections illustrating the transfer of a thin film to an alternate substrate using a double transfer process of the present invention.

A double (or multiple) transfer process of the present invention is illustrated in FIGS. 2A–F. FIG. 2A, which is similar to FIG. 1A, shows a GaAs substrate 20, an AlAs or AlGaAs etch-stop layer 22, and an epitaxial layer 24 grown atop layer 22. Epitaxial layer 24 may comprise one or more epitaxial growths or thin layers, such as GaAs, InGaAs, and AlGaAs for fabricating HBTs, as in the example above. The top of epitaxial layer 24 is then bonded to a rigid, temporary substrate 26 using a releasable bonding material 25. Bonding material 25 may comprise a glue or resin that can be released, for example, with a thermal, chemical, or photo-activated process. Preferably, temporary substrate 26 comprises a rigid, porous material such as porous alumina ($Al_2O_3$), for example. Porous alumina has a coefficient of thermal expansion that is a good match for GaAs and InP substrates so that strain on the thin film is reduced during the transfer process. A porous material provides a good temporary substrate 26 because the surface hole size can be small enough not to damage the fragile thin film to be transferred but still allow resin releasing solvents to penetrate substrate 26 for fast release of the temporary bond.

Porous materials suitable for temporary substrate 26 are typically made by taking a powder form of the desired material (perhaps combined with a binder material to improve bonding), pressing it into a desired shape, and sintering it to strengthen the bonds. The material is generally chosen to optimize a certain characteristic, such as coefficient of thermal expansion, for example. The pore size of the final material is largely determined by the particulate size of the forming powder. The density, or porosity, of the final material is a function of the force used to press the powder into the desired shape. The pressed and sintered porous material can be made into a suitable temporary substrate 26 using well known shaping and polishing methods.

There are many materials that can be prepared as porous substrate 26. Aluminum oxide pressed powder disks, for example, are commercially available and have a fairly good match to the coefficient of thermal expansion of GaAs. Also, a variety of glasses can be prepared as porous substrate 26, some of which have a good match to the coefficient of thermal expansion of silicon. In theory, it should be possible, although probably not always practical, to prepare any chemically stable solid, including diamond and most metals, as porous substrate 26.

The pore size of temporary substrate 26 should be large enough to allow for rapid transport of resin releasing agents through the substrate, but small enough that layer 24 is supported effectively by the releasable bonding agent 25 where layer 24 traverses a pore of the porous material of substrate 26. Therefore, the pore size of substrate 26 should be a fraction of the average thickness of the releasable resin 25. For typical resin thicknesses of 15 to 30 microns, for example, the pore size should be in the 5 to 20 micron range.

Figure 2B:
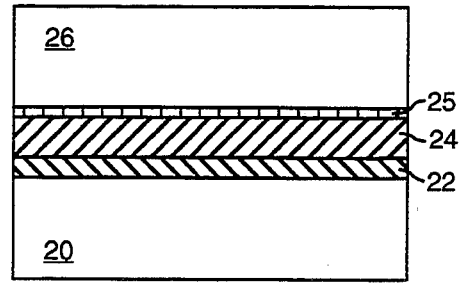
Figure 2C:
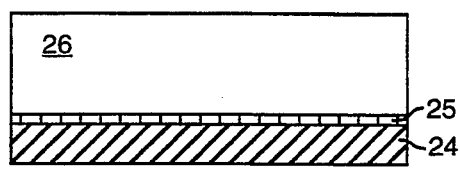
Figure 2D:
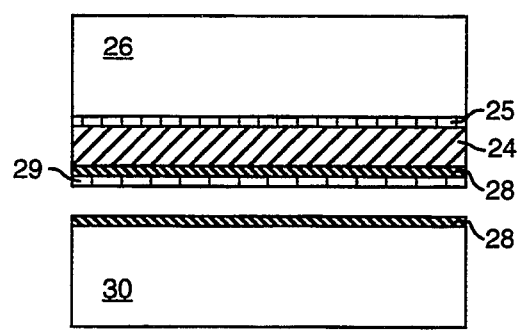

After temporary substrate 26 has been bonded to epitaxial layer 24, as illustrated in FIG. 2B, original substrate 20 and etch-stop layer 22 are removed as described above, resulting in the structure shown in FIG. 2C. A host substrate 30, as described above, may then be bonded to the bottom surface of epitaxial layer 24. As stated above, bonding of layer 24 to host substrate 30 may be accomplished using a resin or glue, a metallic solder for good thermal conductivity, or chemical bonds that would form if host substrate 30 were deposited directly on layer 24. In the process illustrated in FIGS. 2D–F, epitaxial layer 24 and host substrate 30 are coated with metal adhesion and barrier layers 28, which may comprise Ti/Pd barrier metal, for example. Metal layers 28 can then be bonded together using a bonding layer 29 of indium (In) or tin (Sn) conductive metal, for example, applied to either or both of metal barrier layers 28. The layers of FIG. 2D are brought together and heated so that bonding layer 29 solders metal barrier layers 28 together to form a solid, thermally conductive bond.

Figure 2E:
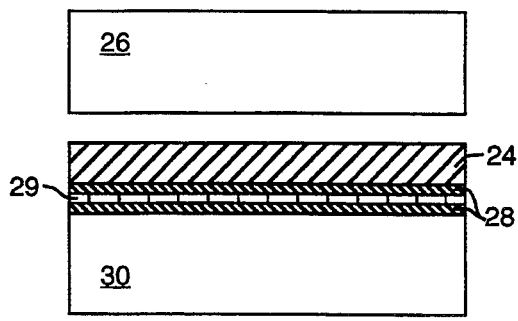
Figure 2F:
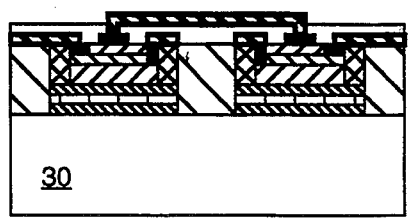

After epitaxial layer 24 has been bonded to host substrate 30, releasable bonding layer 25 is dissolved or otherwise released, as shown in FIG. 2E, using a chemical, thermal, or ultraviolet process, for example. After cleaning as necessary to remove residual temporary bonding material 25, epitaxial layer 24, now bonded to host substrate 30, is ready for conventional fabrication of circuit devices as illustrated in FIG. 1F. In this double transfer process, the final orientation of epitaxial layer 24 (which may comprise a plurality of thin layers as described above) is its original growth order. As can be seen, transferred layer 24 will end up in a face up or face down orientation depending on the number of transfers (i.e., even or odd) in the overall process.

The method of the present invention has be described with reference to HBT epitaxial layers grown on a GaAs substrate. The process, however, is applicable to the transfer of any thin film to an alternate, rigid substrate. Prior art transfer processes that use flexible membranes can damage delicate films and circuits by bending the layers during transfer. Transfer processes that rely on chemical attack of a bonding layer exposed along the edge of a wafer severely limit the size of the thin film patch that can be released and transferred. The present invention is most applicable to the transfer of a thin film, such as an epitaxial layer (or layers) or a complete semiconductor circuit, for example, from a growth substrate to a host substrate having more desirable performance characteristics. In addition to the example described above, it is useful to transfer III-V semiconductor optoelectronic devices onto silicon chips to form hybrid devices. The host substrate may comprise any suitable material, such as diamond, polycrystalline AlN, sapphire, or silicon, for example.

Temporary substrate 26 may comprise any rigid material that can be released after it is temporarily bonded to the thin film being transferred. As stated above, porous ceramic materials used as temporary substrate 26 have advantages in allowing a chemical solvent to reach and dissolve the glue or resin 25 used for the temporary bond. The temporary bonding material 25 my comprise a material that can be released using a thermal, chemical, or photochemical process, for example. Selected portions of a thin film can be released and/or transferred by using a photosensitive glue and an optical mask to expose and release selected regions of the thin film layer onto specific spots of the new substrate. Likewise, if the glue is thermally releasable, certain regions can be heated while others are not to release and/or transfer only selected regions.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. A method of transferring a thin film to an alternate substrate, comprising the steps of:
   providing a first semiconductor substrate;
   forming an etch-stop layer atop said first substrate;
   depositing said thin film atop said etch stop layer, said thin film comprising at least one layer of deposited material;
   providing a rigid host substrate;
   coating said thin film and said host substrate with respective layers of adhesive barrier metal;
   applying a layer of bonding metal to at least one of said layers of adhesive barrier metal:
   bringing said coated thin film and said coated host substrate together with said bonding metal in between; and
   heating said layers so that said bonding metal solders said adhesive barrier metal layers to form a thermally conductive bond between said thin film and said host substrate; and
   removing said first substrate and said etch-stop layer from said thin film.

2. The method of claim 1, wherein said coating step comprises coating said thin film and said rigid host substrate with respective layers of Ti/Pd barrier metal, and said step of applying a layer of bonding metal further comprises selecting said bonding metal from the group consisting of indium and tin.

3. The method of claim 1, wherein the step of removing said first substrate comprises reactive ion etching said first substrate up to said etch-stop layer.

4. A method of transferring an epitaxial thin film to an alternate substrate, comprising the steps of:
   providing a first semiconductor substrate;
   forming an etch-stop layer atop said first substrate;
   growing said epitaxial thin film atop said etch stop layer, said epitaxial thin film comprising at least one layer of epitaxially grown material;
   releasably bonding a temporary substrate comprising a rigid, porous material atop said epitaxial thin film;
   removing said first substrate and said etch-stop layer from said epitaxial thin film;
   bonding said epitaxial thin film to a rigid host substrate; and
   releasing said temporary substrate from atop said epitaxial thin film.

5. The method of claim 4, wherein said providing and forming steps comprise providing said first substrate of III-V semiconductor material and forming said etch-stop layer with a material selected from the group consisting of AlAs and AlGaAs.

6. The method of claim 4, wherein said growing step comprises growing said epitaxial thin film to have at least one layer of material selected from the group consisting of GaAs, AlGaAs, and InGaAs.

7. The method of claim 4, wherein said step of releasably bonding comprises bonding said temporary substrate atop said epitaxial thin film using a material selected from the group consisting of thermally, chemically, and photochemically releasable glues and resins.

8. The method of claim 4, wherein the step of removing said first substrate comprises reactive ion etching said first substrate up to said etch-stop layer.

9. The method of claim 4, wherein bonding said epitaxial thin film further comprises the steps of:
   coating said epitaxial thin film and said rigid host substrate with respective layers of adhesive barrier metal;
   applying a layer of bonding metal to at least one of said layers of adhesive barrier metal;
   bringing said coated epitaxial layer and said coated host substrate together with said bonding metal in between; and
   heating said layers so that said bonding metal solders said adhesive barrier metal layers to form a thermally conductive bond between said epitaxial thin film and said host substrate.

10. The method of claim 9, wherein said coating step comprises coating said epitaxial thin film and said rigid host substrate with respective layers of Ti/Pd barrier metal, and said step of applying a layer of bonding metal further comprises selecting said bonding metal from the group consisting of indium and tin.

11. The method of claim 4, wherein said step of bonding said epitaxial thin film comprises applying an adhesive between said epitaxial layer and said host substrate.

12. The method of claim 4, wherein the step of bonding said epitaxial thin film comprises depositing said host substrate directly atop said epitaxial thin film.

13. A method of transferring an epitaxial thin film to an alternate substrate, comprising the steps of:
   providing a first substrate comprising a III–V semiconductor material;
   forming an etch-stop layer atop said first substrate;
   growing said epitaxial thin film atop said etch stop layer, said epitaxial thin film comprising at least one layer of epitaxially grown material;
   releasably bonding a temporary substrate comprising a rigid, porous material atop said epitaxial thin film;
   removing said first substrate and said etch-stop layer from said epitaxial thin film;
   bonding said epitaxial thin film to a rigid host substrate comprising a material selected from the group consisting of diamond, aluminum nitride, sapphire, and silicon; and
   releasing said temporary substrate from atop said epitaxial thin film.

14. The method of claim 13, wherein bonding said epitaxial thin film further comprises the steps of:
   coating said epitaxial thin film and said rigid host substrate with respective layers of Ti/Pd barrier metal;
   applying a layer of bonding metal to at least one of said layers of Ti/Pd barrier metal, said bonding metal selected from the group consisting of indium and tin;
   bringing said coated epitaxial layer and said coated host substrate together with said bonding metal in between; and
   heating said layers so that said bonding metal solders said adhesive barrier metal layers to form a thermally conductive bond between said epitaxial thin film and said host substrate.

15. The method of claim 13, wherein said step of releasably bonding comprises bonding said temporary substrate atop said epitaxial thin film using a material selected from the group consisting of thermally, chemically, and photochemically releasable glues and resins.

16. The method of claim 13, wherein said etch-stop forming step comprises forming said etch-stop layer with a material selected from the group consisting of AlAs and AlGaAs, and said growing step comprises growing said epitaxial thin film to have at least one layer of material selected from the group consisting of GaAs, AlGaAs, and InGaAs.

17. The method of claim 13, wherein said step of releasably bonding comprises bonding a temporary substrate of porous alumina atop said epitaxial thin film.

* * * * *